(12) United States Patent
Kaneda et al.

(10) Patent No.: US 6,223,429 B1
(45) Date of Patent: *May 1, 2001

(54) METHOD OF PRODUCTION OF SEMICONDUCTOR DEVICE

(75) Inventors: Aizou Kaneda, Yokohama; Masaaki Yasuda, Tsukuba; Itsuo Watanabe, Shimodate; Tomohisa Ohta, Tochigi-ken; Fumio Inoue, Tsukuba; Yoshiaki Tsubomatsu, Tsuchiura; Toshio Yamazaki; Hiroto Ohata, both of Tsukuba; Kenzo Takemura, Yuki; Akira Nagai; Osamu Watanabe, both of Tsukuba; Naoyuki Shiozawa, Tochigi-ken; Kazuyoshi Kojima, Tsukuba; Toshiaki Tanaka, Tsukuba; Kazunori Yamamoto, Tsukuba, all of (JP)

(73) Assignee: Hitachi Chemical Company, Ltd. (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/981,509
(22) PCT Filed: Jun. 13, 1996
(86) PCT No.: PCT/JP96/01608
  § 371 Date: Jul. 30, 1998
  § 102(e) Date: Jul. 30, 1998
(87) PCT Pub. No.: WO96/42107
  PCT Pub. Date: Dec. 27, 1996

(30) Foreign Application Priority Data

Jun. 13, 1995 (JP) .................................................. 7-146363
Dec. 27, 1995 (JP) .................................................. 7-340096

(51) Int. Cl.$^7$ ........................................................ H05K 3/30
(52) U.S. Cl. ................................ 29/832; 29/840; 29/846; 174/260; 228/179.1; 228/180.21
(58) Field of Search ........................... 174/260; 361/767, 361/743, 820; 228/179.1, 180.21; 29/832, 840, 846

(56) References Cited

U.S. PATENT DOCUMENTS 4,740,657 * 4/1988 Tsukagoshi et al. ............... 174/88 R
4,764,804 * 8/1988 Sahara et al. ........................ 357/81

(List continued on next page.)

FOREIGN PATENT DOCUMENTS

| 130089/1985 | 3/1987 | (JP) . |
| 63-160350 * | 7/1988 | (JP) . |
| 5-013119 * | 1/1993 | (JP) . |
| 59-094441 * | 5/1994 | (JP) . |
| 6-349973 | 12/1994 | (JP) . |
| 7-297560 | 11/1995 | (JP) . |

*Primary Examiner*—Carl J. Arbes
(74) *Attorney, Agent, or Firm*—Pennie & Edmonds LLP

(57) ABSTRACT

To provide a highly reliable semiconductor device structure that enables cost reduction in the production of packages, inclusive of the cost for chips, and may cause less changes in connection resistance even under conditions of a long-term environmental resistance test.

In a semiconductor device comprising a semiconductor chip face-down bonded to a wiring board, it has a structure wherein projecting metal portions are provided at the opposing wiring board terminals without forming bumps on bonding pads of the chip, the whole chip surface is bonded with an organic, anisotropic conductive adhesive material, and the whole or at least an edge of the back of the chip is covered with a sealing material.

3 Claims, 5 Drawing Sheets

U.S. PATENT DOCUMENTS

| | | | |
|---|---|---|---|
| 4,955,132 | * | 9/1990 | Ozawa .................................. 29/840 |
| 5,084,961 | * | 2/1992 | Yoshikawa ........................... 29/840 |
| 5,225,966 | * | 7/1993 | Basavanhally et al. ............. 361/406 |
| 5,535,101 | * | 7/1996 | Miles et al. .......................... 367/808 |
| 5,586,892 | * | 12/1996 | Sato ..................................... 439/91 |
| 5,634,268 | * | 6/1997 | Dalal et al. ........................... 29/840 |
| 5,740,606 | * | 4/1998 | Rose ..................................... 29/840 |
| 5,843,251 | * | 12/1998 | Tsukagoshi et al. .................. 156/64 |
| 6,000,127 | * | 12/1999 | Eifuku et al. ......................... 29/840 |
| 6,081,038 | * | 6/2000 | Murayama . |
| 6,101,708 | * | 8/2000 | Okano et al. ......................... 29/832 |
| 6,137,184 | * | 10/2000 | Ikegami . |

* cited by examiner

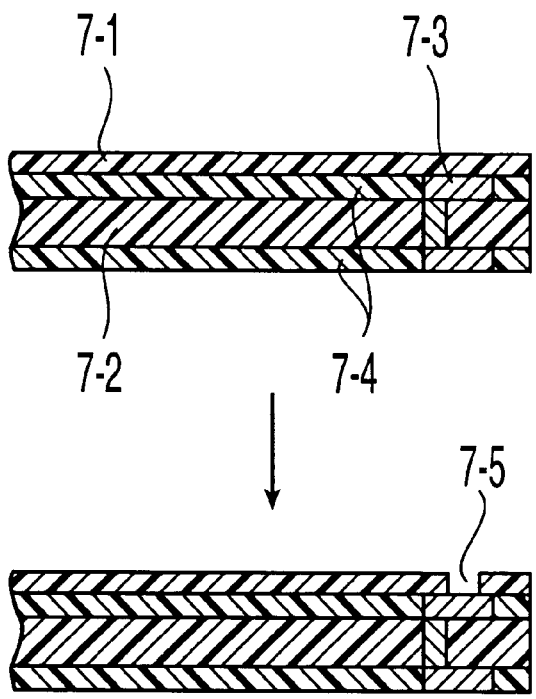
*Fig. 7a*
*Fig. 7b*
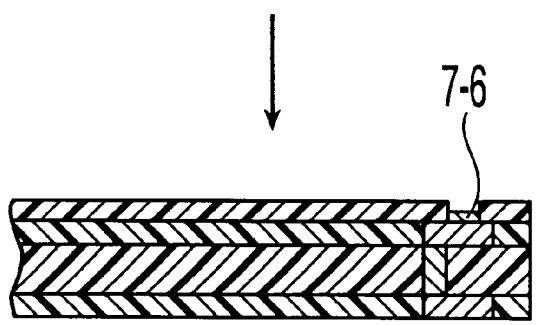
*Fig. 7c*
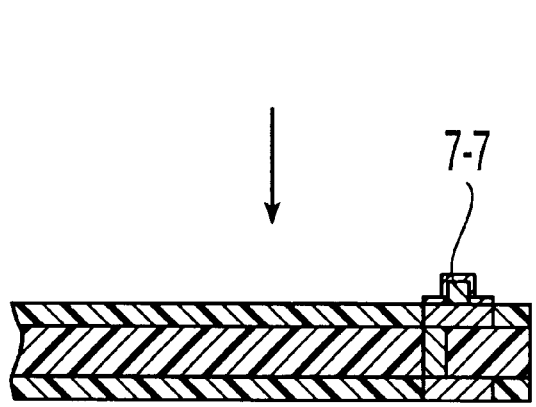
*Fig. 7d*

METHOD OF PRODUCTION OF SEMICONDUCTOR DEVICE

TECHNICAL FILED

This invention relates to a semiconductor device suited for connecting and packaging semiconductor elements on a wiring-circuit board (motherboard) through connectors, a wiring board for mounting semiconductors which is used for fabricating the semiconductor device, and a process for fabricating the semiconductor device.

More particularly, the present invention provides a semiconductor device that enables high-density packaging, is inexpensive and has a high reliability, and a process for its fabrication.

BACKGROUND ART

In recent years, as a method by which semiconductor elements having connecting terminals in a large number are connected and packaged in a high density on a wiring-circuit board (motherboard), a BGA (ball grid array) package of an OMPAC (overmolded packaging) system has been developed and is being put into practical use, according to which chips are mounted on an organic wiring board, pads on the chips are connected to connecting terminals on the side of the organic wiring board by gold-wire wire bonding, thereafter the whole semiconductor chips are covered with an organic insulating sealing material, and solder balls are arranged in arrays on the back of the organic wiring board to provide external terminals.

This structure can make the number of external terminals larger per unit area than conventional QFPs having a structure wherein chips are mounted on a metal lead frame and gold-wire wire bonding is carried out, thereafter the whole is sealed, and the external terminals are cut and formed so as to extend out of the sides of sealed portions. This has a characteristic feature that surface-mounted packaging on the motherboard by solder reflowing can be carried out with ease. However, since this requires gold-wire bonding, the size of semiconductor pads to be connected must be limited to about 80 µm and also a certain distance must be ensured between the pad and the wiring terminal. Accordingly, its external size can not help being as large as 40 mm square or more in order to form a BGA package having i/o terminals of 500 pins or more. This structure has had a limit for situations a needing much more pins and on packaging on the motherboard in a higher density.

Meanwhile, in order to meet the need for higher-density packaging of semiconductor chips each having 500 pins or more, a flip-chip bonding system is proposed (C4) in which metal plating for various barriers is applied to bonding pads of a semiconductor chip and thereafter solder bumps are formed, followed by heat-melt face-down bonding to the terminals on the side of the wiring board through the bumps. Application of this system is partly put forward in ceramic substrates. However, it is forecasted that the process up to the formation of solder bumps on the pads of the semiconductor chip has so many steps as to result in a very high cost of semiconductor chips, that the stress due to temperature cycling is concentrated on solder bumps unless the gap between the chip surface and the wiring board is filled with resin, that the processing and management of such filling with resin are troublesome, and that an attempt to use it to connect bumps to the organic wiring board may result in greater difference in coefficient of linear expansion between bumps and chips to make the stress greater. Accordingly, the flip-chip bonding of i/o terminals of 500 pins or more is not actually available at present.

Meanwhile, a method is proposed in which gold wires are wire-bonded to the bonding pads of a semiconductor chip and are cut at positions close to necks so that gold bumps can be formed on chips at a lower cost (i.e., stud bumps). However, in order to connect and package such chips on the wiring board by face-down bonding, it is essential to use a process in which an organic conductive adhesive is coated on the stud bumps and, after connection and curing, the gap between the chip surface and the wiring board is filled with resin. Also, there remains a problem that the process has a large number of steps since it requires the step of gold-wire bonding for each chip, and also that the size of the pads of chips is limited to 80 µm square and can not be made larger than that.

DISCLOSURE OF THE INVENTION

The present invention is intended to solve the problems of the prior art, and to provide a semiconductor device that is constituted using inexpensive chips having not gone through any bump formation process and using a relatively inexpensive organic high-density wiring board, can achieve high-density packaging through a simpler process and also has a high reliability, and a process for its fabrication.

Accordingly, the present invention provides semiconductor devices described in the following (1) to (3), a wiring board described in (4), and fabrication processes described in (5) to (7).

(1) A semiconductor device comprising a semiconductor chip face-down connected and mounted on a wiring board, wherein the semiconductor chip has a connecting pad which is concave lower than the surface of a passivation film of the chip, and the wiring board is provided at its connecting terminal with a metal bump which projects higher than at least the wiring portion; the connecting pad of the semiconductor chip and the metal bump of the connecting terminal of the wiring board are joined through, and the whole or part of the semiconductor chip surface and its opposing wiring board surface are adhesion-fixed with, an organic, anisotropic conductive adhesive material.

(2) In the semiconductor device described in the above (1), the semiconductor chip has a connecting pad which is concave lower than the surface of a passivation film of the chip, and the wiring board is provided at its connecting terminal with a metal bump which has a diameter smaller than the connecting pad of the semiconductor chip and is projected at a level identical to or higher than the depth of the pad; the connecting pad of the semiconductor chip and the metal bump of the connecting terminal of the wiring board are joined through, and the whole of the semiconductor chip surface and its opposing wiring board surface are adhesion-fixed with, an organic, anisotropic conductive adhesive material, the whole or at least an edge of the back of the semiconductor chip is covered with an insulating organic sealing material, and an external terminal is provided in a matrix on the back of the wiring board.

(3) In the semiconductor device described in the above (1), the organic, anisotropic conductive adhesive material is an anisotropic conductive adhesive film having a double-layer structure comprised of a layer formed of an organic matrix only or an organic matrix with inorganic filler particles dispersed therein and a layer formed of an organic matrix with conductive particles dispersed therein; the layer formed of an organic matrix only or an organic matrix with inorganic filler particles dispersed therein is provided on the side coming into contact with the semiconductor chip surface, and the layer formed of an organic matrix with conductive particles dispersed therein is provided on the connecting terminal side of the wiring board.

(4) A wiring board for mounting a semiconductor thereon, used in the semiconductor device of the present invention, comprising:

a metal bump which is projected higher than at least the wiring portion, provided at the connecting terminal on one surface of the wiring board;

an organic, anisotropic conductive adhesive material for face-down bonding and adhesion-fixing the semiconductor chip, provided at the part including at least the metal bump and opposing to the semiconductor chip surface; and an external terminal having conduction to the connecting terminal, provided on the other surface of the wiring board.

The projected metal bump of this wiring board for mounting a semiconductor thereon may preferably be formed in a single-layer or multiple-layer construction of a metal or alloy selected from Cu, Cr, Ni, Pd, Au and a PbSn solder.

(5) A process for fabricating a semiconductor device, comprising the steps of:

forming an organic, anisotropic conductive adhesive material on the surface of a wiring board at its part where a semiconductor chip is mounted; the wiring board being provided at its connecting terminal with a metal bump which is projected higher than at least the wiring portion; and face-down heat contact bonding a semiconductor chip having a connecting pad from the surface of which a metal oxide film has been removed.

(6) A process for fabricating a semiconductor device, comprising the steps of:

cutting the anisotropic conductive adhesive film described in the above (3), in a size fitted to or a little smaller than a semiconductor chip, on the surface of a wiring board provided at its connecting terminal with a metal bump which is projected higher than at least the wiring portion;

heat contact bonding the film to the wiring board; and face-down heat contact bonding a semiconductor chip having a connecting pad the surface of which has been treated by plasma ashing or ion milling or the like to remove a metal oxide film present thereon.

(7) A process for fabricating a semiconductor device, comprising the steps of:

cutting the anisotropic conductive adhesive film described in the above (3), in a size fitted to or a little smaller than a semiconductor chip, on the surface of a wiring board provided at its connecting terminal with a metal bump which is projected higher than at least the wiring portion;

heat contact bonding the film to the wiring board;

face-down heat contact bonding a semiconductor chip having a connecting pad the surface of which has been treated by plasma ashing or ion milling or the like to remove a metal oxide film present thereon;

covering the whole or part including at least an edge of the back of the semiconductor chip, with an insulating organic sealing material; and forming solder balls in a matrix on the back of the wiring board.

The semiconductor device according to the present invention is a semiconductor device comprising a semiconductor chip face-down connected and mounted on a wiring board, and is characterized in that the semiconductor chip has a connecting pad which is concave lower than the surface of a passivation film of the chip, the wiring board is provided at its connecting terminal with a metal bump which projects higher than at least the wiring portion, and the connecting pad of the semiconductor chip and the metal bump of the connecting terminal of the wiring board are joined through, and the whole or part of the semiconductor chip surface and its opposing wiring board surface are adhesion-fixed with, an organic, anisotropic conductive adhesive material.

In the wiring board of the present invention for mounting a semiconductor thereon, a metal bump which projects higher than at least the wiring portion is provided at the connecting terminal on one surface of the wiring board, an organic, anisotropic conductive adhesive material for face-down bonding and adhesion-fixing the semiconductor chip is provided at the part including at least the metal bump and opposing the semiconductor chip surface, and an external terminal having conduction to the connecting terminal is provided on the other surface of the wiring board.

The process of the present invention for fabricating a semiconductor device is characterized in that the device is fabricated through the steps of;

forming an organic, anisotropic conductive adhesive material on the surface of a wiring board at its part where a semiconductor chip is mounted; the wiring board being provided at its connecting terminal with a metal bump which projects higher than at least the wiring portion; and face-down heat contact bonding a semiconductor chip having a connecting pad from the surface of which a metal oxide film has been removed.

In the present invention, in order to package a bumpless semiconductor chip at bonding pads (connecting pads) of which no bumps are formed by connecting it to wiring board terminals, projecting metal bumps are formed at the wiring board terminals and the chip is joined thereto with an organic, anisotropic conductive adhesive material by face-down bonding. The projecting metal bump at the wiring board terminal forms a projection which has an area smaller than the pad of the semiconductor chip and has a height equal to the concave level (the height of the passivation film) or higher than that and within the layer thickness of the organic, anisotropic conductive adhesive material to be coated in film. The organic, anisotropic conductive adhesive material covers the whole surface of the chip so as to be bonded to the opposing wiring board surface, and also allow electrical conduction between the connecting pad of the semiconductor chip and the projected metal bump of the wiring board terminal through conductive particles dispersed in the organic, anisotropic conductive adhesive material. Also, in order to ensure the reliability of connection at the joints, a structure is taken in which the whole or at least part including an edge of the back of the semiconductor chip is covered with a different insulating organic sealing material so that the force for pressing the chip against the wiring board can be strengthened. Still further, in order to remove metal oxide films present on the bonding pad surfaces of the semiconductor chip, the chip is treated by plasma ashing or ion milling before it is bonded to the wiring board with the organic, anisotropic conductive adhesive material.

The bonding pad (connecting pad) of the chip and the wiring board terminal having the projected metal bump are joined with the organic, anisotropic conductive adhesive material, and the electrical conduction is ensured through fine conductive particles (several to 20 particles/bump) contained in the organic, anisotropic conductive adhesive material. With regard to the conduction to adjoining terminals, an insulating matrix resin present between particles provides no electrical conductivity and ensures anisotropic conductivity only in the direction of contact bonding. The matrix resin having insulating properties may preferably be a thermosetting resin which is constituted of a resin having adhesive properties to the semiconductor chip and wiring board and having excellent insulating properties, and is capable of melting to turn fluid at the temperature of heat contact bonding (usually within the range of 120 to 250° C.) and curing in a short time (within 20 seconds), besides epoxy resin and phenoxy resin. The resin may also be a thermoplastic resin having adhesive properties as exemplified by polyester, polyvinyl butyral and polyimide resins or a composite mixture of the thermoplastic resin and the thermosetting resin. For the purpose of making the matrix resin have a low coefficient of linear expansion and a low modulus of elasticity in order to lessen the stress caused by the difference in coefficient of thermal expansion between the semiconductor chip and the bumps, an inorganic filler such as quartz or elastic fine particles of an elastomer or the like may be compounded and dispersed in the matrix resin in such an amount that does not adversely affect the anisotropic conductivity. A material that is liquid at room temperature may also be used, but an anisotropic conductive film previously formed into a film is easier to handle, is unlikely to cause voids at the time of bonding, and has a superior reliability.

The matrix resin of the organic, anisotropic conductive adhesive material may preferably be a resin having a modulus of elasticity of from 100 to 1,500 MPa at 40° C. after the bonding Ooining) to electrically connect the electrodes in the direction of pressing. As the resin having a modulus of elasticity of from 100 to 1,500 MPa at 40° C. after the bonding and achievable of a good fluidity at the time of connection and a high connection reliability, a resin may be used which is obtained by compounding a mixture of epoxy resin and a latent curing agent such as an imidazole, a hydrazide, a boron trifluoride-amine complex, a sulfonium salt, an amineimide, a salt of polyamine or a dicyandiamide or the like, with an acrylic rubber so as to have the modulus of elasticity of from 100 to 1,500 MPa at 40° C. after the bonding. The modulus of elasticity of adhesive film cured products can be measured using, e.g., RHEOSPECTRER DVE-4 (tensile mode; frequency: 10 Hz; temperature rise: 5° C./min.), manufactured by Rheology K.K.

The acrylic rubber may include polymers or copolymers having as monomer components at least one of acrylic acid, acrylate, methacrylate and acrylonitrile. In particular, copolymer acrylic rubbers containing glycidyl acrylate or glycidyl methacrylate containing a glycidyl ether group are preferably used. Any of these acrylic rubbers may preferably have a molecular weight (weight average) of 200,000 or more in view of enhancing the cohesive force of the adhesive material. If the acrylic rubber is compounded in the adhesive material in an amount less than 15% by weight, the modulus of elasticity at 40° C. after bonding may exceed 1,500 MPa, and if in an amount more than 40% by weight, the modulus of elasticity can be made lower but a high melt viscosity may result at the time of bonding to make the molten adhesive less removable at the interface between mutual connecting electrodes or between connecting electrodes and conductive particles, so that the electric conduction between mutual connecting electrodes or between connecting electrodes and conductive particles can not be ensured in some cases. Hence, the acrylic rubber may preferably be compounded in an amount of from 15 to 40% by weight. The adhesive material may be compounded with a thermoplastic resin such as phenoxy resin so that film-forming properties can be more improved. In particular, the phenoxy resin is structurally similar to epoxy resin, and hence is preferred as having superior compatibility with and adhesive properties to the epoxy resin.

The film is formed by coating on a releasable substrate a fluid prepared by dissolving or dispersing an adhesive composition comprised of at least these epoxy resin, acrylic rubber, phenoxy resin and the latent curing agent, and the conductive particles, in an organic solvent, followed by removal of the solvent at a temperature not higher than the activation temperature of the curing agent. The solvent used here may preferably be a mixed solvent of an aromatic hydrocarbon solvent and an oxygen-containing solvent because the solubility of materials can be improved.

As described above, when the resin having a modulus of elasticity of from 100 to 1,500 MPa at 40° C. after the bonding is used as the matrix resin of the organic, anisotropic conductive adhesive material, it is possible to absorb the internal stress caused in reliability tests such as thermal shock, PCT and bath immersion tests. Hence, the chip and wiring board may warp less after connection when the chip and wiring board have a great difference in coefficient of thermal expansion, and the connection resistance at connecting portions does not become great and the adhesive does not come off even after the reliability tests, bringing about an improvement in the connection reliability. Thus, this is advantageous when IC chips and a printed-circuit board are connected only in the direction of pressing.

The conductive particles dispersed in the matrix resin may be a metal having good conductivity as exemplified by Ni, Ag, Au and Cu, and may be formed of core polymer particles coated with any of these metals or a plurality of these metals. Also, in order to improve insulating properties in the lateral direction of metal particles, those prepared by forming very thin organic insulating films on the metal particles or metal-coated particles themselves may be used. Metal particles of Ni, Cu, Ag or W coated with noble metal such as Au or Pt may also be used. In order to ensure the anisotropic conductivity, the conductive particles described above may preferably have an average particle diameter of from 0.5 to 20 $\mu$m, and more preferably from 1 to 20 $\mu$m, and may preferably be compounded and dispersed in an amount ranging from 0.1 to 30% by volume, and more preferably from 0.2 to 15% by volume, as volume ratio with respect to the organic matrix.

However, since the conductive particles become fluid on the chip surface together with the matrix resin when the organic, anisotropic conductive adhesive material is heat contact bonded, an anisotropic conductive film having a double-layer structure may preferably be used in order to prevent the chip surface from being damaged. The present inventors have found it preferable to use an anisotropic conductive film having a double-layer structure comprised of a layer formed of the matrix resin only or together with an inorganic filler dispersed therein, such as fine quartz particles having substantially spherical cross sections, and a layer in which any of the above metal particles, resin particles coated with metal or particles coated with very thin organic insulating films; the former layer being on the chip surface side, and the latter layer on the wiring board side.

The organic, anisotropic conductive adhesive material employing as the matrix resin the resin having a modulus of elasticity of from 100 to 1,500 MPa at 40° C. after bonding may have a single-layer structure consisted of the matrix resin with the conductive particles dispersed therein, or a double-layer structure consisted of a layer formed of the matrix resin only or the matrix resin with an inorganic filler particles dispersed therein and a layer formed of the matrix resin with the conductive particles dispersed therein.

To form the projected metal bumps at the terminals on the wiring board side, a board having completed the steps of forming a Cu circuit and coating a solder resist is coated with a photoresist, followed by exposure and development steps to form columnar or prismatic holes at the terminals of the board. Using the photoresist as a mask, Cu plating is applied to form metal pillar projections, followed by the step of Ni and Au plating to form metal bumps. The photoresist used may preferably be of a film type having excellent plating solution resistance.

Au plating may also be applied on platable metal such as Cr or Pd in order to prevent the circuit wiring material Cu from its thermal diffusion. In order to attain a much higher L/D, a polyimide film coated with an adhesive is stuck onto the board by vacuum lamination, and holes are formed at wiring board terminals by $CO_2$ gas laser processing or the like, followed by the process of metal plating as described above. Thereafter, the polyimide film is stripped off, and thus the projected metal bumps are formed at the wiring board terminals. Projections of Cu may be formed by a conventional etching process, and thereafter the bumps may be formed by Ni/Au plating. The present invention is by no means limited to any of the above methods or the types of metals used.

In the present invention, the projected metal bump is formed at the wiring board terminal as a projection which has an area smaller than the pad of the semiconductor chip and has a height equal to the concave level (the height of the passivation film) or higher than that and within the layer thickness of the organic, anisotropic conductive adhesive material. Incidentally, the arrangement of metal bumps formed at wiring board terminals is designed in conformity with the positional arrangement of bonding pads of the semiconductor chip. When the projected metal bumps are formed at the wiring board terminals, a difference in the position of terminals causes a scattering of electric-field distribution to cause a scattering of the height of bumps formed. However, since they are connected through the anisotropic conductive film, the scattering of connection resistance between terminals can be too small to have any significance. However, Au plating may be applied to form the metal bumps after any scattering of height of metal bumps has been corrected through the step of polishing carried out after the step of electroless Cu plating or electrolytic plating.

At the bonding pads (connecting pads) of the semiconductor chip, Al wiring materials are laid bare and their surfaces are covered with oxide films. Even though the metal bumps provided at the wiring board terminals and the pads joined with the organic, anisotropic conductive adhesive material as they are, a high initial connection resistance may result unless the oxide films are destroyed. Accordingly, the present inventors have found that a more stable and lower connection resistance can be achieved by treating the chip surface by plasma ashing, or ion milling such as Ar sputtering, immediately before their connection with the organic, anisotropic conductive adhesive material, to remove the oxide films.

As for the organic, anisotropic conductive adhesive material, if the chip and the board are bonded with it over the whole surface, the anisotropic conductive adhesive material itself acts as if it is an under-filler, and any local stress at the connecting areas is dispersed, so that a structure is provided which basically has a superior temperature cycling resistance. However, if the chip has a size as large as 7 mm square or more, the chip tends to warp after bonding. In order to make the chip warp less, it is necessary to use a material having a lower modulus of elasticity than general-purpose anisotropic conductive adhesive materials used to connect TCP for semiconductor. Hence, when the chip is connected only with the anisotropic conductive adhesive material, a clamping stress ascribable to the anisotropic conductive film thus bonded is relaxed to cause a gradual increase in connection resistance. Such a phenomenon was seen in long-term environmental resistance tests such as a temperature cycling resistance test and a moisture resistance reliability test. To solve this problem, they have also found that the changes in connection resistance as a result of a long-term environmental resistance test can be prevented by providing a structure wherein the whole back surface of the chip is covered with a sealing material having a higher modulus of elasticity than at least the anisotropic conductive material or a structure wherein, also with respect to devices which must be fitted with a heat sink plate for heat dissipation, at least part of the edges of the chip is covered so that the anisotropic conductive adhesive material can be prevented from being relaxed in the vertical direction. However, with regard to chips having a small size of less than 7 mm square and devices which need not assure long-term reliability, such an additional sealing is not required. Thus, the structure according to the present invention is by no means limited only to those having a sealed structure.

The board used in the wiring board of the present invention may include laminated sheets prepared by impregnating a base material such as glass cloth with a heat resistant resin such as epoxy resin followed by drying and then lamination of copper foil, those prepared by laminating copper foil to a heat resistant film such as polyimide film with an adhesive, and flexible boards prepared by coating copper foil with a heat resistant resin such as polyimide followed by drying to cure, any of which may be used. In the case when a flexible board made of polyimide or the like is used as the board, the board can be made to have a small thickness (0.1 mm or less, e.g., about 0.025 mm), thus semiconductor packages can be made thinner.

It is common for the wiring board to be worked in the form of a frame having a plurality of cavities (chip mounting areas) which are arranged end to end, in order to improve operating efficiency in the step of mounting chips or sealing them. The frame can be formed by a method in which a board provided with wiring is punched using a die or the like to make frame partition walls and wiring board areas in an integral form using the same board material.

Stated specifically, the semiconductor device according to the present invention as described above can be produced in the following way.

The organic, anisotropic conductive adhesive material is coated on the IC-mounting area of the wiring board, optionally followed by drying, or the anisotropic conductive film is cut in X-Y size identical to, or a little smaller, than the size of the semiconductor chip (a cutting step), followed by putting it on the semiconductor chip mounting area of the wiring board provided with the projected metal bumps at the connecting terminals, and heat contact bonding by means of a hot press (a provisional contact bonding step). Continually or within a day of the surface of the semiconductor chip being treated by plasma ashing, the respective terminals are automatically registered using a flip-chip bonder, followed by heat contact bonding on the anisotropic conductive film with the chip surface down (a main contact bonding step). At this stage, a high-temperature operation test (a burn-in test) for semiconductor devices is carried out, and non-defective devices are sorted from defective devices. Thereafter, with respect to only the non-defective devices, the whole back surface of the chip is encapsulated using a usual transfer molding equipment and mold.

It may be encapsulated by injection using a liquid sealing material (a encapsulatg step). Thereafter, solder balls are formed on the back of the wiring board (a solder ball forming step). With regard to devices that require a heat dissipation structure, only part of the chip periphery is molded and, to the cavity thus formed, a heat dissipating heat sink plate is adhesion-fixed with a highly heat-conductive adhesive.

A vertical cross section of the entire structure of a semiconductor device according to a first embodiment of the present invention is shown in FIG. 1.

In FIG. 1, reference numeral 1—1 denotes a semiconductor chip (a bumpless IC chip); 1-2, an organic, anisotropic conductive adhesive material; 1-3, an organic wiring board with fine metal bumps; 1-4, a wiring board terminal with a fine metal bump; 1-5, a sealing material (a molding resin); 1-6, solder balls; 1-7, a through-hole; and 1-8, solder resists.

A cross section at the part where the fine metal bumps at the wiring board terminals and the bonding pads (connecting pads) of the bumpless semiconductor chip are joined with the organic, anisotropic conductive adhesive material is shown in FIG. 2.

In FIG. 2, reference numeral 2-1 denotes a semiconductor chip (a bumpless IC chip); 2-2, a bonding pad; 2-3, a passivation film; 2-4, a first-layer of an anisotropic conductive film (a conductive particles non-dispersed layer); 2-5, a second-layer of an anisotropic conductive film (a conductive particles dispersed layer); 2-6, conductive particles; 2-7, a wiring board terminal with a projected metal bump; 2-8, a wiring board; 2-9, solder balls; and 2-10, a sealing material.

The fabrication process according to an embodiment of the present invention is shown in FIG. 3.

In FIG. 3, reference numeral 3-1 denotes an anisotropic conductive film; 3-2, an organic wiring board with projected metal bumps; 3-3, plasma; 3-4 a semiconductor chip (a bumpless IC chip); 3-5, a bonding pad; 3-6, a sealing material (an epoxy molding compound); and 3-7, solder balls.

A support film of the anisotropic conductive film is peeled off. The anisotropic conductive film is cut in a predetermined size and mounted on the organic wiring board with projecting metal bumps under registration, and the middle portion, excluding the terminal portions, is pressed to carry out heat contact bonding (FIG. 3a).

The top surface of the semiconductor chip is irradiated with plasma to remove the oxide films on bonding pad surfaces (FIG. 3b).

The chip is turned face down, and the board is preheated. With registration of the chip, the chip is bonded under application of heat and pressure (flip-chip bonding; FIG. 3c).

Chips are sorted out to exclude defective chips, and transfer molding is carried out using the epoxy molding compound, followed by post curing (FIG. 3d).

Using a ceramic jig, solder balls are arranged and then heated to transfer them to the terminals on the back of the board to form the solder balls (FIG. 3e).

A vertical cross section of the entire structure of a semiconductor device according to a second embodiment of the present invention is shown in FIG. 4.

In FIG. 4, reference numeral 4-1 denotes a heat sink plate; 4-2, a highly heat-conductive adhesive; 4-3, a sealing material; 4-4, a projected metal bump; 4-5, a semiconductor chip; 4-6, an organic, anisotropic conductive adhesive material; 4-7, a board; 4-8, solder resists; and 4-9, solder balls.

A vertical cross section of the entire structure of a semiconductor device according to a third embodiment of the present invention is shown in FIG. 5.

In FIG. 5, reference numeral 5-1 denotes semiconductor chips (IC chips); 5-2, organic, anisotropic conductive adhesive materials; 5-3, a board with projected metal bumps; 5-4, a sealing material; 5-5, a lead frame; 5-6, surface-mounted packaged electronic parts; 5-7, a metal eutectic joint; and 5-8, reflow solders.

A vertical cross section of the entire structure of a semiconductor device according to a fourth embodiment of the present invention is shown in FIG. 6.

In FIG. 6, reference numeral 6-1 denotes semiconductor chips (IC chips); 6-2, organic, anisotropic conductive adhesive materials; 6-3, a board with projected metal bumps; 6-4, sealing materials (liquid sealing materials); 6-5, an external terminal lead; and 6-6, surface-mounted packaged electronic parts.

An example of a process for forming the projected metal bumps at the wiring board terminals is shown in FIG. 7.

In FIG. 7, reference numeral 7-1 denotes a resist film; 7-2, an organic wiring board (a product having completed the steps of Cu wiring and solder resist coating); 7-3, a board terminal; 7-4; solder resists; 7-5, a resist opening; 7-6, a Cu projection; and 7-7, an Ni/Au coating.

To the organic wiring board (a product having completed the steps of Cu wiring and solder resist coating), a resist film having been cut is applied and bonded by means of a laminator (FIG. 7a).

The resist is exposed and developed (FIG. 7b), and Cu plating is applied to a thickness of 25 $\mu$m or more to from the Cu projection (FIG. 7c).

The resist is stripped off, Ni plating is applied to a thickness of 5 $\mu$m or more, and Au plating is applied in a thickness of 0.5 $\mu$m or more to form the projected metal bump (FIG. 7d).

FIG. 8 is a vertical cross section showing a process for fabricating a semiconductor device according to a fifth embodiment of the present invention. In FIG. 8, reference numeral 8-1 denotes a polyimide film; 8-2, a bump; 8-3, wiring; 8-4, an organic, anisotropic conductive adhesive material; 8-5, a semiconductor chip; 8-6, a sealing material; and 8-7, solder balls.

According to the present invention, since the bumps may not be provided on the IC chip side, the step of forming various metal barrier layers and the step of forming fine solder bumps become unnecessary in the processing of wafers for fabricating ICs, so that the yield of chips is improved, the number of steps can be made smaller and the cost for chips can be made lower. Moreover, the process of forming metal bumps at the wiring board terminals is relatively simple, and hence does not cause any great cost increase. Since the IC chip and the wiring board terminals are totally joined with the organic, anisotropic conductive adhesive material, the number of steps can be reduced advantageously as the number of pins becomes larger, compared with conventional wire-bonding systems. Furthermore, since the organic, anisotropic conductive adhesive material also serves as an under-filler, the step of and management for impregnation of the under-filler are unnecessary, compared with the C4-process solder bump bonding. Because of the foregoing effects, it has become possible to reduce packaging cost as a total process.

Still furthermore, according to the present invention, since a structural measure is taken against the stress relaxation of the organic, anisotropic conductive adhesive material, it has become possible to apply the device in the field where a reliability higher than the reliability in the field of conventional liquid-crystal devices is required. Also, the package size can be made smaller than in the conventional wire-bonding system.

BRIEF DESCRIPTION OF THE DRAWINGS

FIG. 7 is a vertical cross section showing a process for forming the projected metal bumps at the wiring board terminals according to the present invention.

BEST MODE FOR WORKING THE INVENTION

EXAMPLE 1

Figure 1:
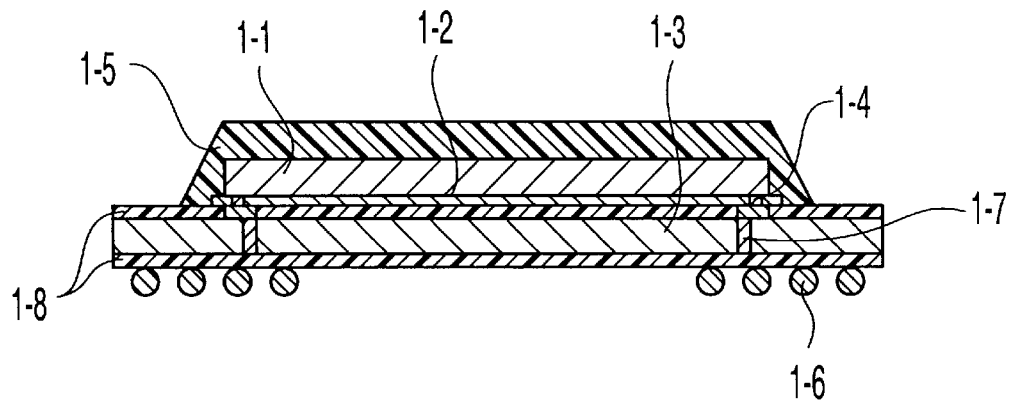
FIG. 1 is a vertical cross section of the entire structure of a semiconductor device according to the first embodiment of the present invention.

The BGA package shown in FIG. 1 was produced by the fabrication process shown in FIGS. 3 and 7. To a board (four-layer board) having completed the steps of Cu wiring, through-hole plating and solder resist coating on an E-679 base material (a counterpart of FR-5), available from Hitachi Chemical Co., Ltd., used as a base, a filmy photoresist (PHOTECK HN340; 30 $\mu$m thick) available from Hitachi Chemical Co., Ltd. was laminated, followed by exposure and development as in prescribed steps to form resist openings (diameter: 100 $\mu$m) at the middle of each wiring board terminal, and further followed by electrolytic Cu plating and resist stripping steps to form a Cu projection of about 25 $\mu$m in height at each wiring board terminal. Subsequently, the steps of electrolytic Ni plating and electrolytic Au plating were carried out to obtain a wiring board with projected metal bumps coated with about 5 $\mu$m thick Ni and about 0.5 $\mu$m thick Au on the whole surfaces of the wiring board terminals (see FIG. 7).

At the chip-mounting area of the board with bumps thus produced, an anisotropic conductive adhesive film (AC8301) having a double-layer structure, available from Hitachi Chemical Co., Ltd., and press-cut to a size of 10 mm square was mounted, followed by provisional contact bonding under conditions of a temperature of 100° C., a pressure of 3 kg/chip and a pressing time of 5 seconds. The board on which the anisotropic conductive adhesive film had been provisionally contact bonded and a bumpless IC chip having been cleaned on its surface by means of a plasma asher to remove Al oxide films present on bonding pads was placed on a flip-chip bonder. The chip was turned face down, positionally adjusted to the area where the anisotropic conductive adhesive film had been provisionally contact bonded, and mounted thereon, followed by main contact bonding under conditions of a temperature of 180° C., a pressure of 15 kg/chip and a pressing time of 20 seconds.

Non-defective chips were sorted out by a conventional burn-in test, and then non-defective chips were transfer molded with a sealing material (epoxy molding compound, CEL9200) available from Hitachi Chemical Co., Ltd., under conditions of a molding temperature of 180° C. and a molding pressure of 150 kg/cm$^2$ to obtain an encapsulated product. Thereafter, using a conventional solder ball forming equipment, solder balls were formed in arrays on the back of the wiring board to obtain a product (see FIG. 3).

Figure 2:
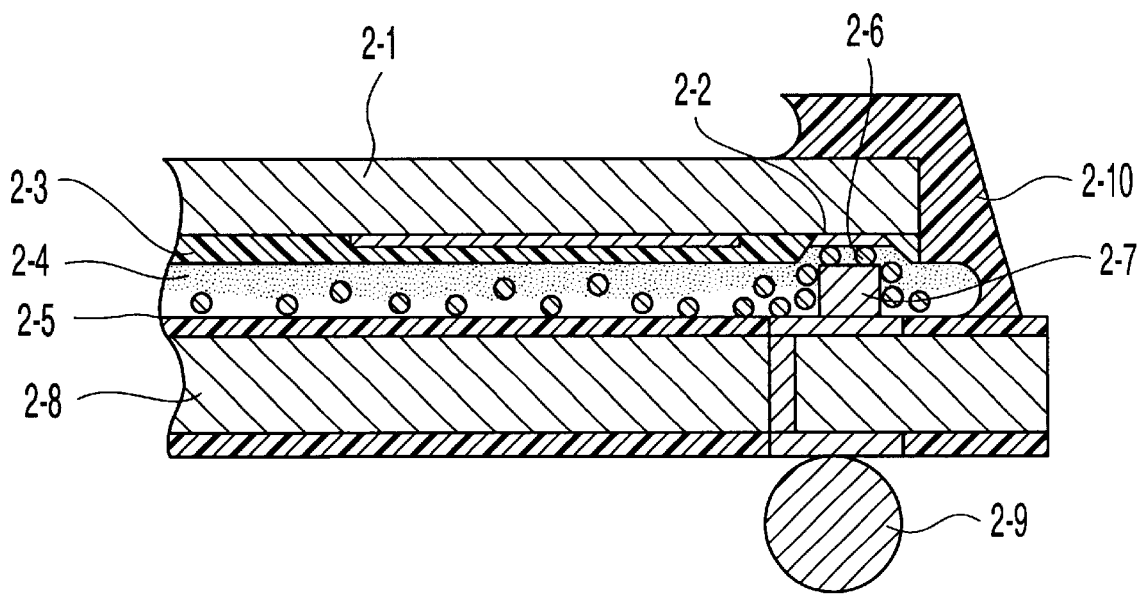
FIG. 2 is a vertical cross section of the main part of the semiconductor device according to the first embodiment of the present invention.
Figure 3A:
FIG. 3 is a vertical cross section showing the process for fabricating the semiconductor device according to the present invention.
Figure 3B:
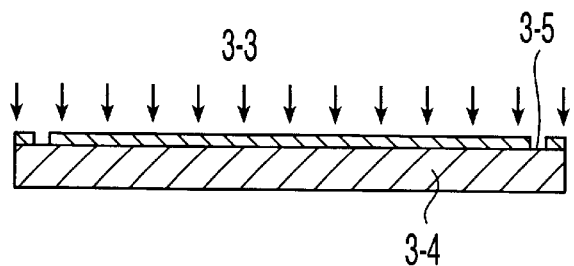
Figure 3C:
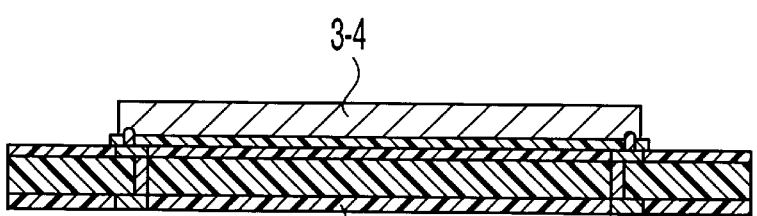
Figure 3D:
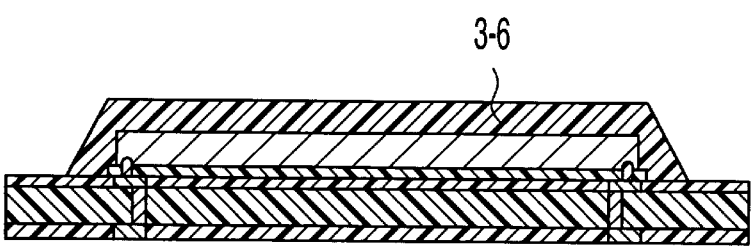
Figure 3E:
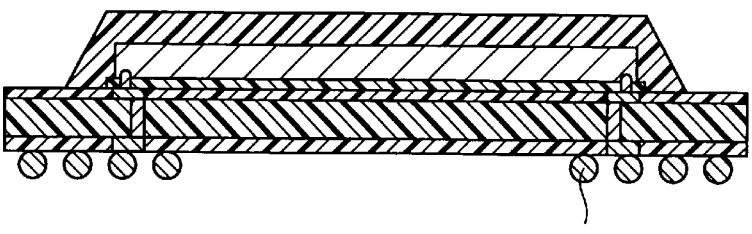
Figure 4:
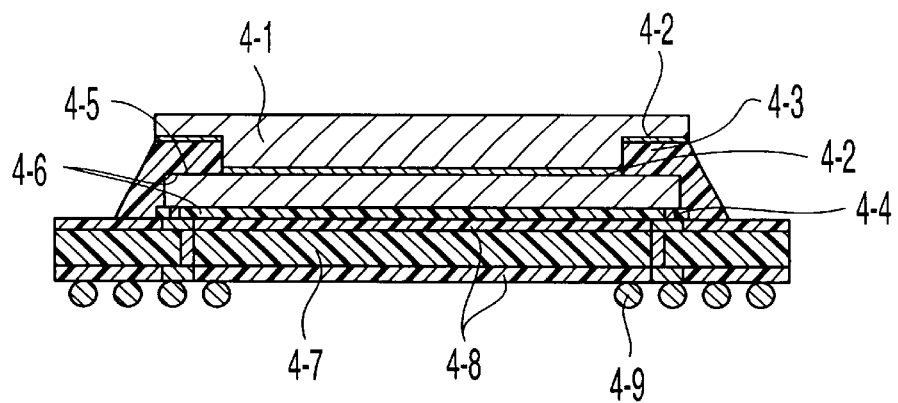
FIG. 4 is a vertical cross section of the entire structure of a semiconductor device according to the second embodiment of the present invention.
Figure 5:
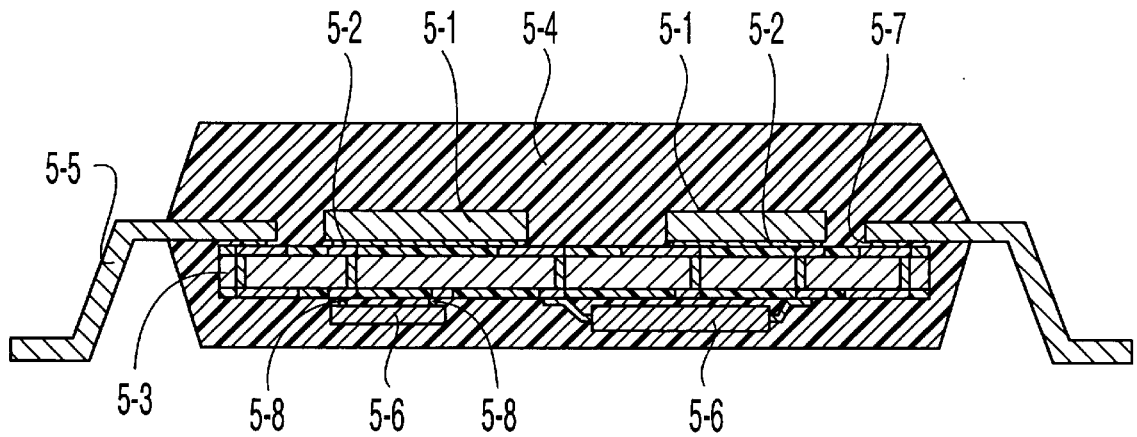
FIG. 5 is a vertical cross section of the entire structure of a semiconductor device according to the third embodiment of the present invention.
Figure 6:
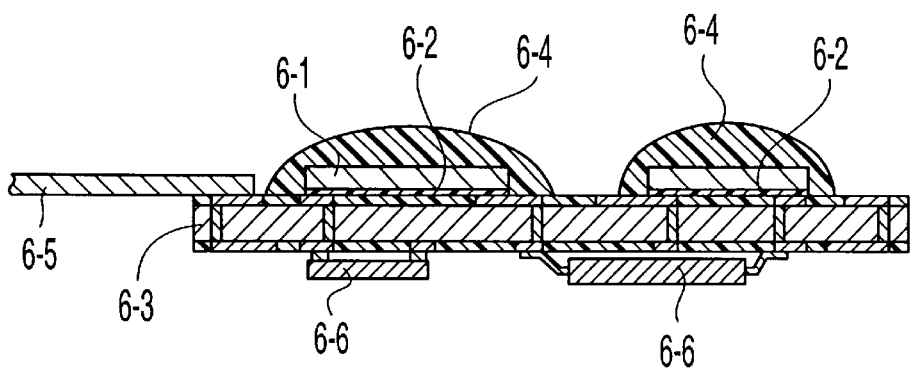
FIG. 6 is a vertical cross section of the entire structure of a semiconductor device according to the fourth embodiment of the present invention.
Figure 8A:
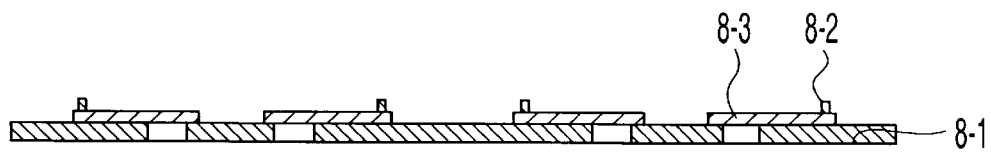
FIG. 8 is a vertical cross section showing a process for fabricating a semiconductor device according to the fifth embodiment of the present invention.
Figure 8B:
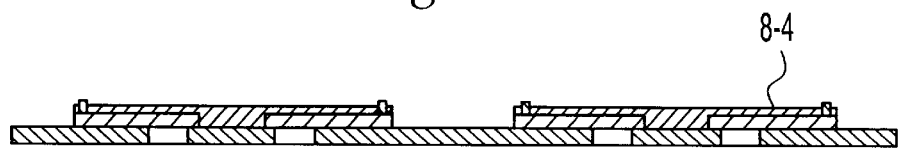
Figure 8C:
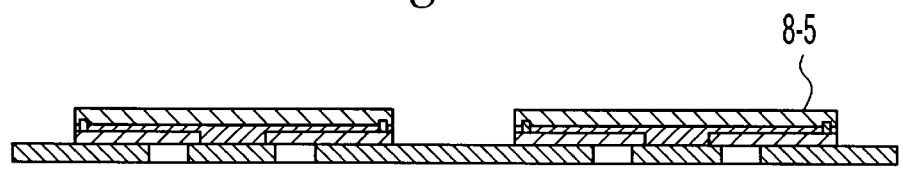
Figure 8D:
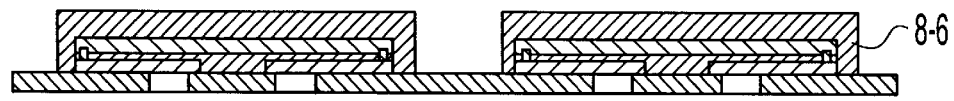
Figure 8E:
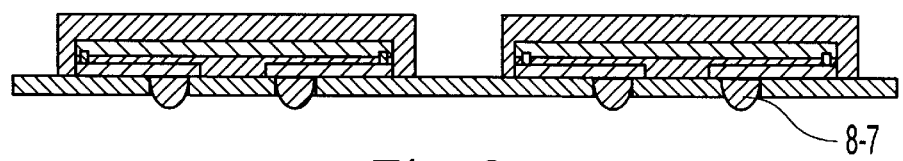
Figure 8F:
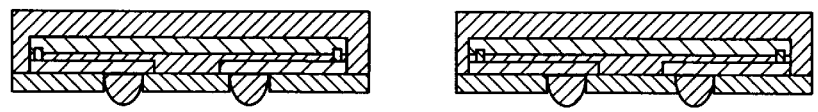

The connection resistance at the joints made through the anisotropic conductive adhesive film was evaluated to obtain the result that the connection resistance at each joint was as low as 10 m $\Omega$ or below and no changes were seen in connection resistance even in samples put to 1,000 cycles of a 65° C. to 150° C. temperature cycling test. The connection resistance was held at 10 m $\Omega$ also in a 100 hr PCT test (121° C., 2 atm). The product was cut to observe its cross section on SEM, to obtain the result that the conductive particles were dispersed mainly on the board side as shown in FIG. 2 and the chip surfaces were seen not to be damaged.

The gaps between the bonding pads of the chip and the metal bumps at the board internal terminals also stood filled with the conductive particles and both came into close contact with each other. Between the terminals, however, the conductive particles were only scattered and none of them were seen to join one another.

EXAMPLE 2

A board with metal bumps was obtained in the same manner as in Example 1. Also in the same manner, a bumpless IC chip was face-down bonded and joined to the opposing board through the anisotropic conductive adhesive film (AC8301).

Chips were sorted by a burn-in test, and then transfer molded with a sealing material (CEL9200) using a mold having top forces projecting to the cavities to obtain an encapsulated molded product whose chip-area top surfaces have middle areas in the form of cavities. To these cavities, heat sink plates were adhesion-fixed with a highly heat-conductive adhesive to obtain a product.

EXAMPLE 3

A board with metal bumps was obtained in the same manner as in Example 1. To the inner leads of an Sn-plated lead frame, the external terminals of the wiring board were connected and mounted by Au/Sn joining. Thereafter, in the same manner as in Example 1, two bumpless IC chips were successively face-down bonded and joined to the wiring board with metal bumps, using the anisotropic conductive adhesive films. Chip capacitors, surface-mounting type of resistance parts and so forth were connected to the back of the board by IR reflowing, followed by inspection and then transfer molding with a sealing material to obtain a product.

EXAMPLE 4

In the same manner as in Example 3, two bumpless IC chips were face-down bonded and joined to the board with metal bumps, using the anisotropic conductive adhesive films. Thereafter, surface-mounted packaging parts were packaged to the back of the board by IR reflowing, and then the whole back surfaces of the two chips were covered with a liquid epoxy sealing material (CEC1900) available from Hitachi Chemical Co., Ltd., followed by curing according to a predetermined curing temperature profile to obtain a product.

Comparative Example 1

Using a board having board terminals not provided with metal bumps, bumpless IC chips were connected through anisotropic conductive adhesive films in the same manner as in Example 1. The connection resistance at the joints made through the anisotropic conductive adhesive films was evaluated to obtain the result that the connection resistance at each joint was as high as 1 to 5 Ω and, in a 24 hr PCT test (120° C., 2 atm), all contacts were failed electrically.

EXAMPLE 5

To a board having completed the steps of Cu wiring, laser hole processing and solder resist coating on a 500I base material (thickness: 25 μm), available from Hitachi Chemical Co., Ltd., used as a base, a filmy photoresist (PHOTECK HN340; 30 μm thick) available from Hitachi Chemical Co., Ltd. was laminated, followed by exposure and development as in prescribed steps to form resist openings (diameter: 100 μm) at the middle of each board terminal, and further followed by electrolytic Cu plating and resist stripping steps to form a Cu projection of about 25 μm in height at each wiring board terminal. Subsequently, the steps of electrolytic Ni plating and electrolytic Au plating were carried out to obtain a wiring board with projected metal bumps coated with about 5 μm thick Ni and about 0.5 μm thick Au on the whole surfaces of the board terminals. This board was punched using a die to obtain a frame having a plurality of cavities arranged end to end.

At the chip-mounting areas of the frame thus produced (the wiring board with bumps), anisotropic conductive adhesive films (AC8301) having a double-layer structure, available from Hitachi Chemical Co., Ltd., and each press-cut to a size of 10 mm square were mounted, followed by provisional contact bonding under conditions of a temperature of 100° C., a pressure of 3 kg/chip and a pressing time of 5 seconds. The frame on which the anisotropic conductive adhesive films had been provisionally contact bonded and bumpless IC chips having had their surfaces cleaned by means of a plasma asher to remove Al oxide films present on bonding pads were placed on a flip-chip bonder. The chips were turned face down, positionally adjusted to the areas where the anisotropic conductive adhesive films had been provisionally contact bonded, and mounted thereon, followed by main contact bonding under conditions of a temperature of 180° C., a pressure of 15 kg/chip and a pressing time of 20 seconds.

Non-defective chips were sorted out by a conventional burn-in test, and then non-defective chips were transfer molded with a sealing material (epoxy molding compound, CEL9200) available from Hitachi Chemical Co., Ltd., under conditions of a molding temperature of 180° C. and a molding pressure of 150 kg/cm$^2$ to obtain an encapsulated product. Thereafter, using a conventional solder ball forming equipment, solder balls were formed in arrays on the back of the wiring board, followed by cutting out of the frame to obtain a product.

EXAMPLE 6

In 400 g of ethyl acetate, 50 g of phenoxy resin and 125 g of acrylic rubber (weight average molecular weight: 850,000) obtained by copolymerization of 40 parts by weight of butyl acrylate, 30 parts by weight of ethyl acrylate, 30 parts by weight of acrylonitrile and 3 parts by weight of glycidyl methacrylate were dissolved to obtain a 30% by weight solution. Subsequently, 325 g of liquid epoxy (epoxy equivalent weight: 185) containing a microcapsule type latent curing agent was added to this solution, followed by stirring and further followed by dispersion of 2% by volume of metal particles which are nickel particles (diameter: 5 μm) gold-plated to a thickness of 600 angstroms to obtain a film-forming coating fluid. This fluid was coated on a separator (polyethylene terephthalate film treated with silicone; thickness: 40 μm) by means of a roll coater, followed by drying at 100° C. for 10 minutes to obtain an adhesive film of 25 μm thick. This adhesive film had a modulus of elasticity of 800 MPa at 40° C. as measured by a dynamic viscoelastometer.

Next, using the adhesive film thus prepared, a bumpless chip (length and breadth: 10 mm; thickness: 0.5 mm; pad electrode: Al; pad diameter: 120 μm) and an Ni/Au-plated Cu printed-circuit board on the circuit of which Ni/Au-plated Cu bumps (diameter: 100 μm; space: 50 μm; height: 15 μm; number of bumps: 200) were formed were connected in the following way.

The adhesive film (length and breadth: 12 mm) was stuck to the Ni/Au-plated Cu printed-circuit board (electrode height: 20 μm; thickness: 0.8 mm) at 80° C. and 10 kgf/cm$^2$. Thereafter, the separator was peeled off, and the Al pads of the chip and the Ni/Au-plated Cu printed-circuit board (thickness: 0.8 mm) provided with the Ni/Au-plated Cu bumps were registered. Subsequently, heat and pressure were applied from the upper part of the chip under conditions of 180° C., 30 g/bump and 20 seconds to effect main connection. After the main connection, the chip had a warpage of 4.8 μm (warpage convexed toward the chip side). After the main connection, the connection resistance was 8 m Ω at maximum per bump and 4 m Ω on the average, and the insulation resistance was 108 Ω or above. These values did not change even after a −55 to 125° C. thermal shock test made 1,000 cycles, a 200 hour PCT test (121° C., 2 atmospheric pressure) and a 260° C. solder bath immersion test for 10 seconds, showing a good connection reliability.

What is claimed is:

1. A process for fabricating a semiconductor device, comprising the steps of:

forming an organic, anisotropic conductive adhesive material on a first surface of a wiring board at its part where a semiconductor chip is mounted, wherein said organic, anisotropic conductive adhesive material has a modulus of elasticity of from 100 to 1,500 MPa at 40° C. after joining and adhesive-fixing;

the wiring board being provided at its connecting terminal with a metal bump which projects higher than at least a wiring portion, wherein said projecting metal bump is formed in a single-layer or multiple-layer construction of a metal or alloy selected from Cu, Cr, Ni, Pd, Au and a PbSn solder; and face-down heat contact bonding a semiconductor chip, having a connecting pad from the surface of which a metal oxide film as been removed, to the wiring board.

2. A process for fabricating a semiconductor device, comprising the steps of:

cutting an anisotropic conductive adhesive film to a size predetermined in accordance with the external shape of a semiconductor chip, on a first surface of a wiring board provided at its connecting terminal with a metal bump which projects higher than at least a wiring portion, wherein said anisotropic conductive adhesive film has a double-layer structure comprised of: (1) a first layer provided on the side coming into contact with the semiconductor chip surface, and formed of an organic matrix only or a composition comprised of an organic matrix and inorganic filler particles dispersed therein; and (2) a second layer provided on the connecting terminal side of the wiring board, and formed of a composition comprised of an organic matrix and conductive particles dispersed therein;

heat contact bonding the film to the wiring board; and face-down heat contact bonding a semiconductor chip, having a connecting pad the surface of which has been treated to remove a metal oxide film present thereon, to the wiring board.

3. The process for fabricating a semiconductor device according to claim 2, which further comprises the steps of:

covering the whole or part including at least an edge of the back of the semiconductor chip, with an insulating organic sealing material; and forming solder balls in a matrix on the back of the wiring board.

* * * * *